757-42 SP
5/6/86 OP - 000,064

United States Statutory Invention Registration [19]

[11] Reg. Number: H64
[45] Published: May 6, 1986

Maleis

[54] FULL-WAVE RECTIFIER FOR CMOS IC CHIP

[75] Inventor: Hanafy E. Maleis, New Providence, N.J.

[73] Assignee: AT&T Bell Laboratories, Murray Hill, N.J.

[21] Appl. No.: 521,059

[22] Filed: Aug. 8, 1983

[51] Int. Cl.[4] ..... H01L 27/02
[52] U.S. Cl. ..... 357/42; 357/40; 357/41; 357/23.1
[58] Field of Search ..... 357/42

[56] References Cited

FOREIGN PATENT DOCUMENTS 52860 6/1982 European Pat. Off. ..... 357/42

*Primary Examiner*—S. C. Buczinski
*Assistant Examiner*—Linda J. Wallace
*Attorney, Agent, or Firm*—Alfred G. Steinmetz

[57] ABSTRACT

A full-wave rectifier is implemented in CMOS integrated circuit chip technology. Two transistors are used in a bridge arrangement with two diodes to implement the rectifier while avoiding parasitic transistor action which previously provided an unwanted current path through the chip substrate to defeat full-wave rectification.

2 Claims, 4 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

FULL-WAVE RECTIFIER FOR CMOS IC CHIP

FIELD OF THE INVENTION

This invention relates to integrated circuit (IC) chips and, more particularly, to such chips in which functional elements are defined by complementary metal-oxide-semiconductor (CMOS) technology.

BACKGROUND OF THE INVENTION

Integrated CMOS chips are well known in the art. It is also well known that CMOS full-wave rectifiers are difficult to achieve. The reason is that in the past any diodes used to define a full-wave rectifier served, via parasitic transistor action, to send current through the chip substrate to ground, thus interfering with the realization of full-wave rectification action.

BRIEF DESCRIPTION OF THE INVENTION

The problem of shorting currents to ground through the substrate is avoided by employing two NMOS transistors as substitutes for two of four diodes normally used for full-wave rectification and by connecting and operating the two transistors so that they function as "diodes" turning on and off. In the illustrative embodiment, the gate electrodes of the transistors are connected across a power supply, the substrate is kept electrically floating and the "sources" of the "diodes" are interconnected for connection to a load.

DETAILED DESCRIPTION

Figure 1:
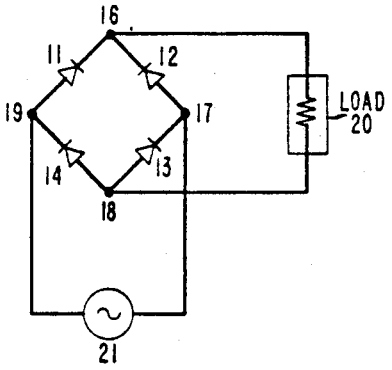
FIG. 1 (PRIOR ART)
FIG. 1 is a circuit diagram of a prior art full-wave rectifier.

FIG. 1 shows a schematic circuit diagram 10 of a prior art full-wave rectifier. The diagram shows the conventional bridge arrangement of four diodes 11, 12, 13 and 14 connected between nodes 16, 17, 18 and 19. Load resistance 20 is connected between nodes 16 and 18. A signal source 21 is connected between nodes 17 and 19. The operation of a prior art, full-wave rectifier is well known and not discussed further herein.

Figure 2:
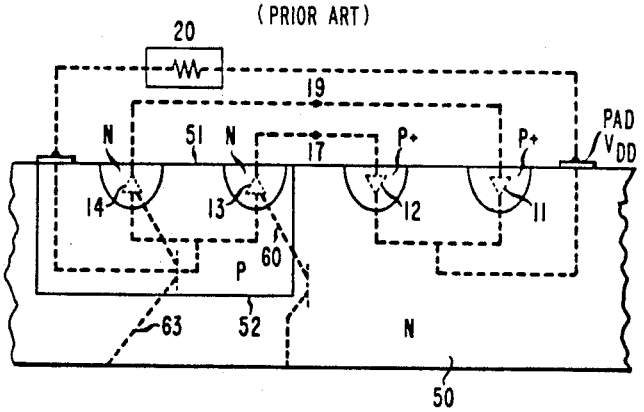
FIG. 2 (PRIOR ART)
FIG. 2 is a cross section of a CMOS chip fragment showing the circuit diagramed in FIG. 1.

Such operation cannot be achieved presently in a CMOS IC chip. The reason for this is explained in connection with FIG. 2. FIG. 2 shows a cross section of a fragment of a CMOS IC chip. The chip has an N-type substrate 50 maintained at voltage $V_{DD}$ with two P-type and two N-type diffused regions adjacent surface 51 formed in p-tub 2. The diffused regions define diodes designated as in FIG. 1 and poled as shown. Diodes 11 and 12 on the one hand and diodes 13 and 14 on the other are connected across resistor 20. Signal source 21 is connected across nodes 17 and 19 of FIG. 1 or FIG. 2.

The structure of FIG. 2 cannot be operated as a full-wave rectifier because of the existence of (parasitic NPN) transistors 60 and 63. When diode 13 is forward biased, for example, current flows in transistor 60 primarily through the substrate rather than through (load) resistor 20 defeating full-wave rectification. A similar transistor action occurs when diode 14 is forward biased via parasitic transistor 63 .

Figure 3:
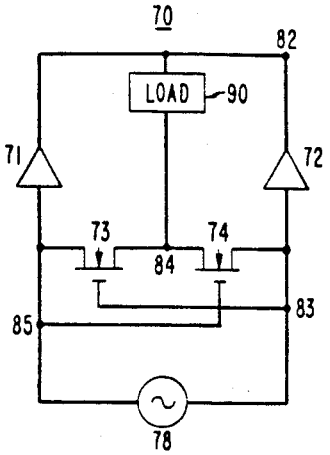
FIG. 3 is a circuit diagram of a full-wave rectifier in accordance with this invention.

FIG. 3 shows a circuit schematic of a full-wave rectifier 70 which can be implemented in CMOS technology. Diodes 71 and 72 of FIG. 3 correspond to diodes 11 and 12 of FIG. 1; transistors 73 and 74 correspond to diodes 14 and 13 of FIG. 1, respectively. Signal source 78 corresponds to signal source 21 of FIG. 1.

The nodes 16, 17, 18 and 19 of FIG. 1 correspond to nodes 82, 83, 84 and 85 of FIG. 3, respectively. It is to be noted that the gate electrode of transistor 74 is connected to node 85, and the gate electrode of transistor 73 is connected to node 83. The sources of transistors 73 and 74, in contradistinction, are connected to nodes 85 and 83, respectively, the drains being connected to node 84.

Figure 4:
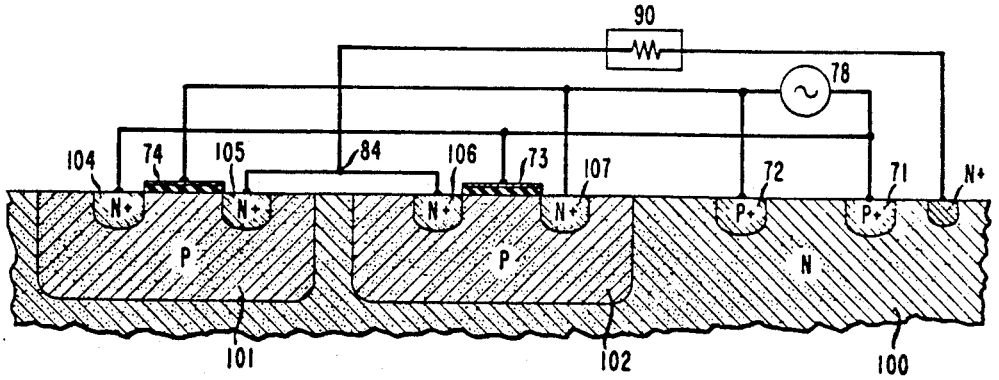
FIG. 4 is a cross section of a CMOS chip fragment showing the circuit diagramed in FIG. 3.

FIG. 4 shows a cross section of an IC fragment for implementing the circuit of FIG. 3. The fragment comprises an N-type substrate 100 in which two p-tub areas 101 and 102 are formed. N+-type diffusion areas 104 and 105 and 106 and 107 define transistors 74 and 73 of FIG. 3, respectively, therebetween.

The various areas are interconnected as represented schematically in FIG. 3. For example, areas 105 and 106 are electrically interconnected at node 84 (compare FIG. 3) for connection to load resistor 90. No parasitic transistors are present for permitting action equivalent to that of transistors 60 and 63 of FIG. 2.

In operation, when node 85 is driven positive by source 78, current flows through diode 71 to load 90. Also, transistor 74 is gated on and, consequently, current flows through transistor 74 but not transistor 73. When node 83 is driven positive, transistor 73 is gated on. Consequently, current flows in load 90 via transistor 73 and diode 72. Full-wave rectification thus is achieved. Parasitic transistor action which, in the arrangement of FIGS. 1 and 2, passes current through the chip substrate, is avoided by the use of transistors which are gated off at appropriate phases of each cycle of operation.

The operation may be thought of as providing alternative complete current paths between an AC source and a load. Each complete current path is formed by adding a first or a second segment, between the source and the load, where each segment includes a diode and a transistor and each is adapted to activate the gate of only the transistor in the other of the first or second segments which includes the diode not instantaneously in use.

What is claimed is:

1. A monolithic rectifier including:

an AC input for accepting an AC source, an output for accepting a DC load, a full-wave rectifier embodied in a complementary metal-oxide semiconductor chip and including a first path segment including a first transistor and a first diode and a second path segment including a second transistor and a second diode, the first and second path segments being connected into a full-wave rectifier circuit, coupling the AC input to the output, the first and second transistors including first and second gate electrodes, respectively, the first and second gate electrodes being connected to the first and second path segments, respectively, such that current of a polarity to activate one of the first and second diodes is operative to activate the gate electrode of one of the first and second transistors connected in the same path segment, in a manner to allow current to flow in one of the first and second path segments whereby the first and second path segments are enabled alternately to complete a circuit path between the input and output means;

the complementary metal-oxide semiconductor chip comprising:

an N-type substrate which is electrically floating, and first and second $P^+$-type surface regions for defining the first and second diodes included in the first and second path segments, respectively, and first and second P-tubs in the substrate, each P-tub including first and second $N^+$-type surface regions, each P-tub with its first and second $N^+$-type surface regions defining one of the first and second transistors, and the output being simultaneously connected to the first $N^+$-type surface region of the first and second P-tubs and to an independent $N^+$-type surface region in the N-substrate.

2. A monolithic full-wave rectifier circuit constructed as a complementary metal-oxide semiconductor chip comprising:

a semiconductor substrate of a first conductivity type and electrically floating, said substrate including first and second tubs of a second conductivity type, each of said first and second tubs including spaced apart surface regions of said first conductivity type defining a source and a drain and a source drain channel of first and second transistors therebetween, said substrate also including spaced apart regions of a second conductivity type for defining first and second diodes, first and second input terminals connected to be energized by an AC source, first and second output terminals for supplying a rectified DC output to a load, and a bridge rectifying circuit coupling first and second input terminals to first and second output terminals, a first electrical path extending from said first input terminal through the source-drain channel of said first transistor to the first of said output terminals, a second electrical path extending from the second of said input terminals through said first diode and an added spaced apart surface region of the first conductivity type to said second output terminal, a third electrical path extending from said second input terminal through the source-drain channel of said second transistor to the first of said output terminals, a fourth electrical path extending from said first input terminal through said second diode and the added spaced apart surface region of the first conductivity type to said second output terminal, the gate of said first transistor being connected to said second input terminal and the gate of the second transistor being connected to the first input terminal, said first and second diodes being poled to conduct during opposite phases of an AC signal.

* * * * *